United States Patent
Li et al.

(10) Patent No.: US 10,312,409 B2
(45) Date of Patent: Jun. 4, 2019

(54) PATTERNED SAPPHIRE SUBSTRATE, LIGHT EMITTING DIODE AND FABRICATION METHOD THEREOF

(71) Applicant: XIAMEN SANAN OPTOELECTRONICS TECHNOLOGY CO., LTD., Xiamen (CN)

(72) Inventors: Binbin Li, Xiamen (CN); Yi-hsiang Hsu, Xiamen (CN); Jingjing Wei, Xiamen (CN); Yu Zhou, Xiamen (CN); Zhen Wang, Xiamen (CN); Kai Xu, Xiamen (CN); Chia-hung Chang, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 15/723,248

(22) Filed: Oct. 3, 2017

(65) Prior Publication Data
US 2018/0026155 A1  Jan. 25, 2018

Related U.S. Application Data

(63) Continuation of application No. PCT/CN2016/097867, filed on Sep. 20, 2016.

(30) Foreign Application Priority Data

Nov. 3, 2015 (CN) .......................... 2015 1 0735204
Nov. 3, 2015 (CN) .......................... 2015 1 0735329

(51) Int. Cl.
*H01L 33/00* (2010.01)
*H01L 33/10* (2010.01)
(Continued)

(52) U.S. Cl.
CPC .......... *H01L 33/10* (2013.01); *H01L 21/0242* (2013.01); *H01L 21/0243* (2013.01);
(Continued)

(58) Field of Classification Search
CPC . H01L 33/10; H01L 21/02658; H01L 33/007; H01L 21/0243; H01L 33/20;
(Continued)

(56) References Cited

U.S. PATENT DOCUMENTS 8,154,035 B2 * 4/2012 Fudeta ................. H01L 33/007
257/91
2010/0059789 A1 * 3/2010 Choi .................. H01L 21/0242
257/103

FOREIGN PATENT DOCUMENTS

CN 101140968 A 3/2008

* cited by examiner

*Primary Examiner* — Vu A Vu
(74) *Attorney, Agent, or Firm* — Syncoda LLC; Feng Ma (57) ABSTRACT

A patterned sapphire substrate has a first surface and a second surface opposite to each other, in which, the first surface of the substrate is formed by arranging a plurality of interspaced patterns, wherein the patterns have a top surface, a bottom surface and a plurality of side surfaces and at least one concave region sandwiched between the adjacent side surfaces and the top surface, where, depth and width of the concave region gradually decrease from the top to the bottom of the pattern. The concave region on the pattern surface of the patterned sapphire substrate enlarges light reflection area, thus improving light extraction efficiency of the patterned sapphire substrate.

16 Claims, 11 Drawing Sheets

(51) Int. Cl.
*H01L 33/22* (2010.01)
*H01L 33/20* (2010.01)
*H01L 21/02* (2006.01)
*H01L 33/32* (2010.01)

(52) U.S. Cl.
CPC .... *H01L 21/0254* (2013.01); *H01L 21/02458* (2013.01); *H01L 21/02658* (2013.01); *H01L 33/007* (2013.01); *H01L 33/20* (2013.01); *H01L 33/22* (2013.01); *H01L 33/32* (2013.01)

(58) Field of Classification Search
CPC ........... H01L 21/0254; H01L 21/02458; H01L 21/0242; H01L 33/22; H01L 33/32
USPC .......................................................... 257/98
See application file for complete search history.

PATTERNED SAPPHIRE SUBSTRATE, LIGHT EMITTING DIODE AND FABRICATION METHOD THEREOF

CROSS-REFERENCE TO RELATED APPLICATIONS

The present application is a continuation of, and claims priority to, PCT/CN2016/097867 filed on Sep. 20, 2016, which claims priority to Chinese Patent Application No. 201510735204.4 filed on Nov. 3, 2015, and Chinese Patent Application No. 201510735329.7 filed on Nov. 3, 2015. The disclosures of these applications are hereby incorporated by reference in their entirety.

BACKGROUND

A patterned sapphire substrate (PSS) is a sapphire substrate with a patterned surface formed via photoetching and etching. The patterned substrate, on the one hand, can effectively reduce dislocation density of the epitaxial structure and improve lattice quality and evenness of the epitaxial material, thereby improving the internal quantum light-emitting efficiency of the light-emitting diode; on the other hand, the pattern structure increases light scattering and changes light route of the light-emitting diode, thus optimizing light extraction chance.

The width of the PSS pattern bottom has certain influence on the light extraction efficiency of the substrate: the wider the bottom is, the larger the pattern surface area is, and therefore the larger the light reflection region is and the higher the light extraction efficiency is. Meanwhile, space between adjacent patterns also has certain influence on the growth of the subsequent epitaxial layer: if space is too small, the inside defect in the formed epitaxial layer increases, which is to the disadvantage of the light extraction of the semiconductor element; and if space is too large, it would lead to a small number of substrate patterns arranged on the substrate surface of same size, thus decreasing substrate light extraction efficiency. Therefore, how to obtain a substrate pattern with appropriate density and large bottom width is one of the key technologies to improve light extraction efficiency of the semiconductor element.

SUMMARY

In an aspect, various embodiments disclosed herein provide a patterned sapphire substrate and a method for fabricating a light-emitting diode with this substrate, wherein, the fabricated patterned sapphire substrate and the light-emitting diode thereon can improve light reflection by the substrate and therefore the light extraction efficiency of the light-emitting diode by enlarging reflection area of the pattern surface of the patterned substrate.

Some embodiments of a patterned sapphire substrate have a first surface and a second surface opposite to each other, in which, the first surface of the substrate is formed by arranging a plurality of interspaced patterns, wherein, the patterns have a plurality of side surfaces and at least one concave region sandwiched between adjacent side surfaces, where, depth and width of the concave region gradually decrease from the top to the bottom of the pattern.

In some embodiments, the pattern also comprises a top surface and a bottom surface, and the concave region is sandwiched between the adjacent side surface and the top surface.

In some embodiments, the concave region is connected by two inclined surfaces. In some other embodiments, the projection of the concave region on the pattern bottom surface appears a triangle.

In some embodiments, the two inclined surfaces appear in axial symmetry.

In some embodiments, the inclined angle between the two inclined surfaces is 90°-150°.

In some embodiments, the pattern top surface appears a convex polygon.

In some embodiments, the side surface is composed of a first side surface and a second side surface with different inclinations that are arranged on the upper and lower parts of the pattern respectively.

In some embodiments, inclination of the first side surface is less than that of the second side surface.

In some embodiments, the second side surface appears as an arcuation or has a shape of an arc.

In some embodiments, the pattern bottom of the substrate is 4-20 μm wide.

In another aspect, the patterned sapphire substrate can be fabricated through methods including the following steps: S71. providing a sapphire plain substrate having a first surface and a second surface opposite to each other, and forming a mask layer with periodically-arranged mask patterns on the first surface; S72. etching the first surface of the sapphire plain substrate via wet etching to form a plurality of periodically-arranged interspaced patterns, wherein the patterns have a plurality of side surfaces and at least one concave region sandwiched between adjacent side surfaces, where, depth and width of the concave region gradually decrease from the top to the bottom of the pattern.

In some embodiments, the mask pattern formed in S71 at least has an outward-extending concave, wherein, the concave corresponds to the lattice direction of the sapphire substrate.

In some embodiments, the mask pattern formed in S71 has a plurality of outward-extending convexes, wherein, the convexes correspond between the lattice directions of the sapphire substrate.

In some embodiments, the convexes and the concaves are arranged alternatively with 3 of each.

In some embodiments, an inclined angle is formed between the adjacent convexes with range of 90°-150°.

In some embodiments, the distance between the edge and the center of the mask pattern formed in S71 is 0.25-10 μm, the mask pattern is 1-10 μm high, and the space between mask patterns is 0.1-10 μm.

In some embodiments, material of the mask layer formed in S71 is photo-resistor, oxide or metal.

In some embodiments, in step S72, form a patterned sapphire substrate by wet etching of the first surface of the sapphire substrate with mixture of concentrated sulfuric acid and phosphate, wherein, etching time is 500-3,500 s, and etching temperature is 150° C.-300° C.

In another aspect, various embodiments of a light-emitting diode are provided, which include any one of the aforesaid patterned sapphire substrates and a light-emitting epitaxial layer formed thereon.

In some embodiments, an AlN layer is formed on the surface of the patterned sapphire substrate via PVD, and the light-emitting epitaxial layer is formed on the AlN layer.

In some embodiments, the AlN layer is 10-200 Å thick.

In another aspect, a fabrication method of a light-emitting diode is provided, including the following steps: S11. providing a sapphire plain substrate having a first surface and a second surface opposite to each other, and forming a mask layer with periodically-arranged mask patterns on the first surface; S12. etching the first surface of the sapphire plain substrate via wet etching to form a plurality of periodically-arranged interspaced patterns, wherein the patterns have a plurality of side surfaces and at least one concave region sandwiched between adjacent side surfaces, where, depth and width of the concave region gradually decrease from the top to the bottom of the pattern; S13. forming an AlN layer on the surface of the patterned sapphire substrate via PVD; and S14. forming a light-emitting epitaxial layer at least comprising an N-type semiconductor layer, a light-emitting layer and a P-type semiconductor layer on the AlN layer via epitaxial growth.

In some embodiments, the pattern in step S12 also includes a top surface and a bottom surface, and the concave region is sandwiched between the adjacent side surface and the top surface.

In some embodiments, the mask pattern formed in S11 at least has an outward-extending concave, wherein, the concave corresponds to the lattice direction of the sapphire substrate.

In some embodiments, the mask pattern formed in S11 also has a plurality of outward-extending convexes corresponding between the lattice directions of the sapphire substrate. In some embodiments, the AlN layer in step S13 is 10-200 Å thick.

In another aspect, a light-emitting diode (LED) having the PSS described above and fabricated with the method described above is provided. In another aspect, a light-emitting system including a plurality of the LEDs are provided. The light-emitting system can be used for lighting, display, signage, etc. Other features and advantages of various embodiments of the present disclosure will be described in detail in the following specification, and it is believed that such features and advantages will become more apparent in the specification or through implementations of various embodiments disclosed herein. The purposes and other advantages of the embodiments can be realized and obtained in the structures specifically described in the specifications, claims and drawings.

BRIEF DESCRIPTION OF THE DRAWINGS

The accompanying drawings, which are included to provide a further understanding of the various embodiments disclosed herein and to constitute a part of this specification, together with the embodiments, are therefore to be considered in all respects as illustrative and not restrictive. In addition, the drawings are merely illustrative, which are not drawn to scale.

In the drawings: 10. patterned sapphire substrate; 11. substrate pattern; 111. bottom surface; 20. patterned sapphire substrate; 21. substrate pattern; 210. top surface; 2101. convex structure on top surface; 2102. concave structure on top surface; 211. bottom surface; 212. side surface; 2121. first side surface; 2122. second side surface; 213. concave region; 2130. inclined surface; 30. pattern of patterned mask layer; 31. concave; 32. convex.

DETAILED DESCRIPTION

Various embodiments of the present disclosure will be described in detail with reference to the accompany drawings.

PSS is generally prepared by dry etching or wet etching. Dry etching mainly uses plasma (ICP) to bombard the surface of the substrate to prepare the pattern, with isotropic characteristics, the prepared graphical morphology is controllable, but prone to physical damage, meanwhile, the surface reflectivity is poor, not conducive to further improve the LED light efficiency. The wet etching mainly adopts the chemical solution to etch the substrate to prepare the pattern, which has the advantages of low equipment cost, simple operation process and high reflectivity of the substrate surface, and is suitable for large-scale industrial production.

Figure 1:
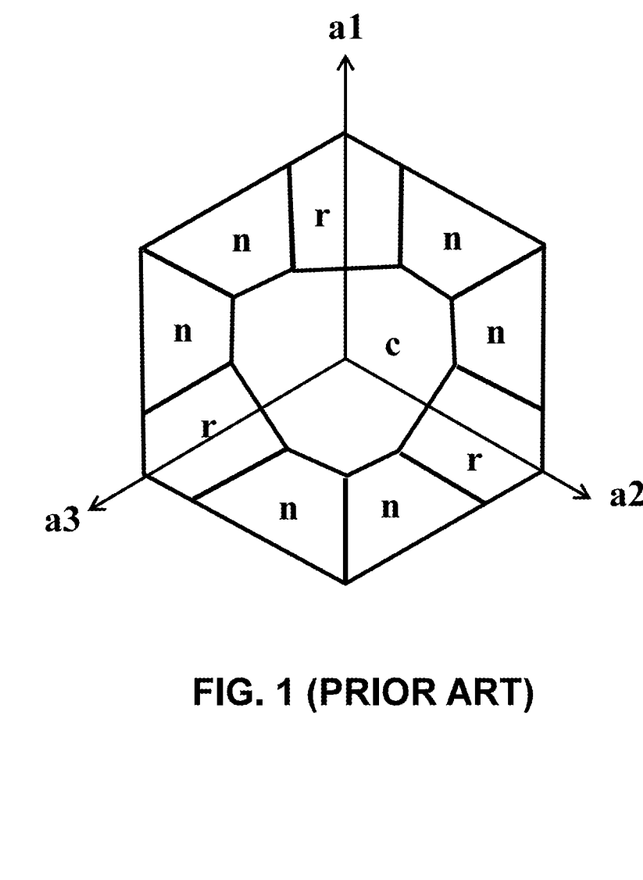
FIG. 1 shows a schematic view of the sapphire lattice structure.
Figure 2:
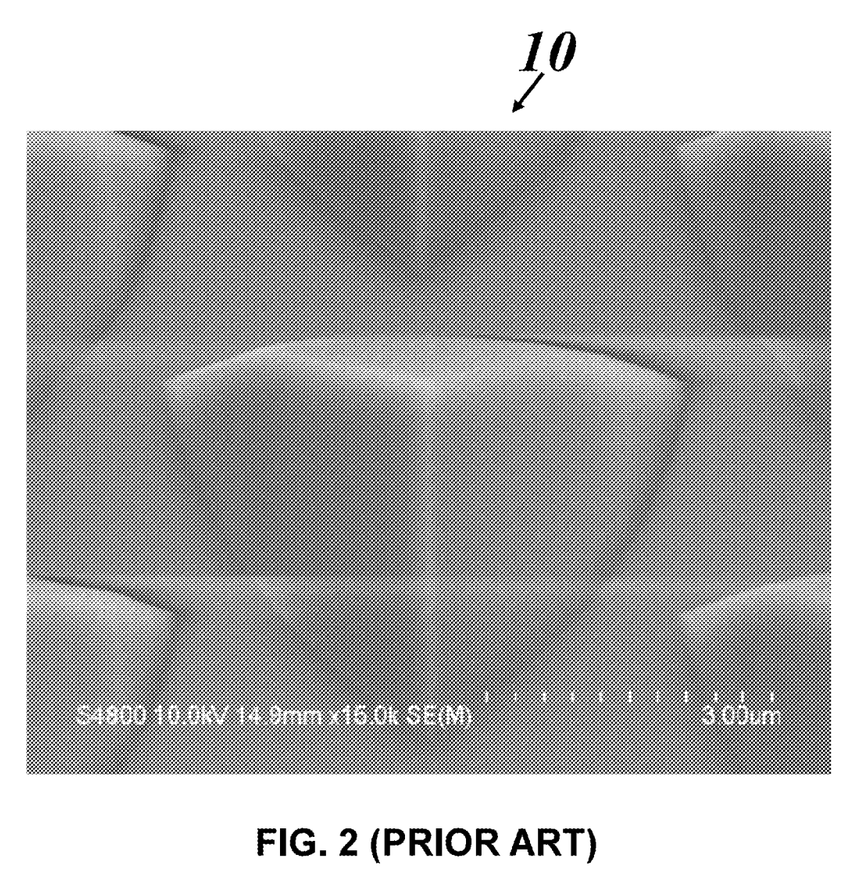
FIG. 2 illustrates a first side view of a SEM of the pattern of a patterned sapphire substrate according to some existing technologies.
Figure 3:
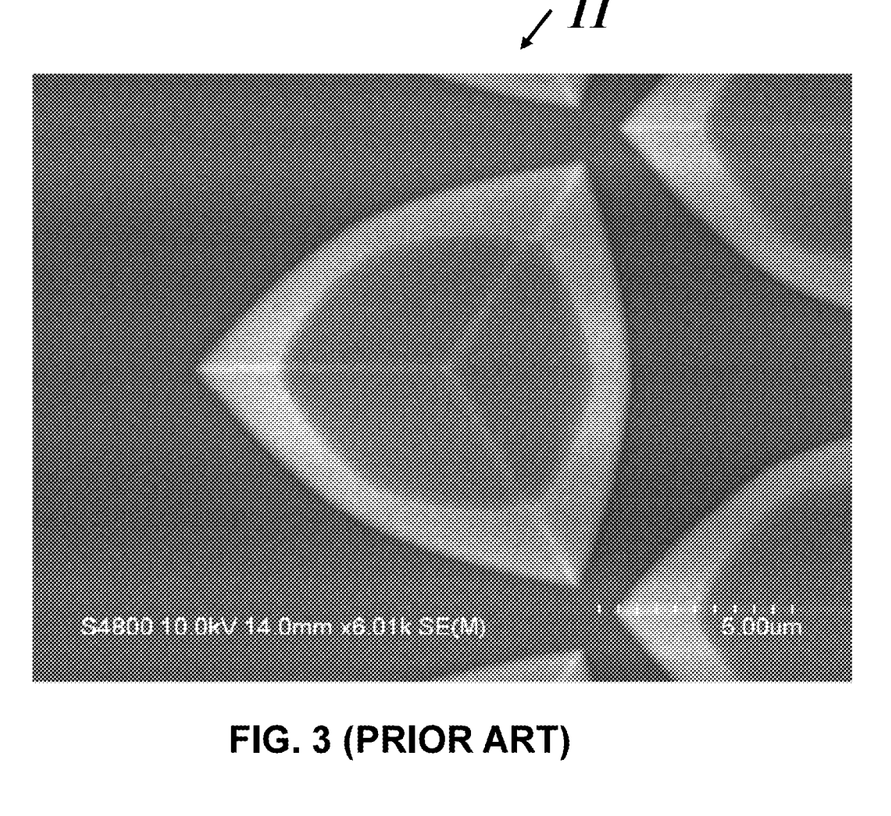
FIG. 3 illustrates a second side view of the SEM of the pattern of the patterned sapphire substrate according to some existing technologies.

FIG. 1 shows a top plan view of a sapphire lattice with a hexagonal lattice structure in which the face to be applied is A, C and R. Since the lattice constant mismatch ratio between the sapphire C surface and the III-V and II-VI Group deposition films is small, the epitaxial growth is usually performed using the C surface. When the sapphire substrate is wet-etched, the etching solution can only corrode in the sapphire crystal lattice due to the characteristics of the sapphire crystal lattice structure, and usually forming a triangular pyramid pattern. FIGS. 2 and 3 show the patterned sapphire substrate 10 obtained by wet etching in the prior art, typically by forming a mask pattern such as a cylindrical mask on the C side of the sapphire substrate and then performing wet etching. In the process of etching, the etching solution, etching time and etching temperature are the three main parameters, when the etching solution and the etching temperature are constant, the etching time is longer, and the width of the obtained substrate pattern is wider but the spacing of adjacent substrate patterns is reduced.

The following embodiments discloses a patterned sapphire substrate which increases the bottom width of the pattern while maintaining the pitch of the substrate pattern constant, and increasing the light-reflecting surface on the pattern surface.

Figure 4:
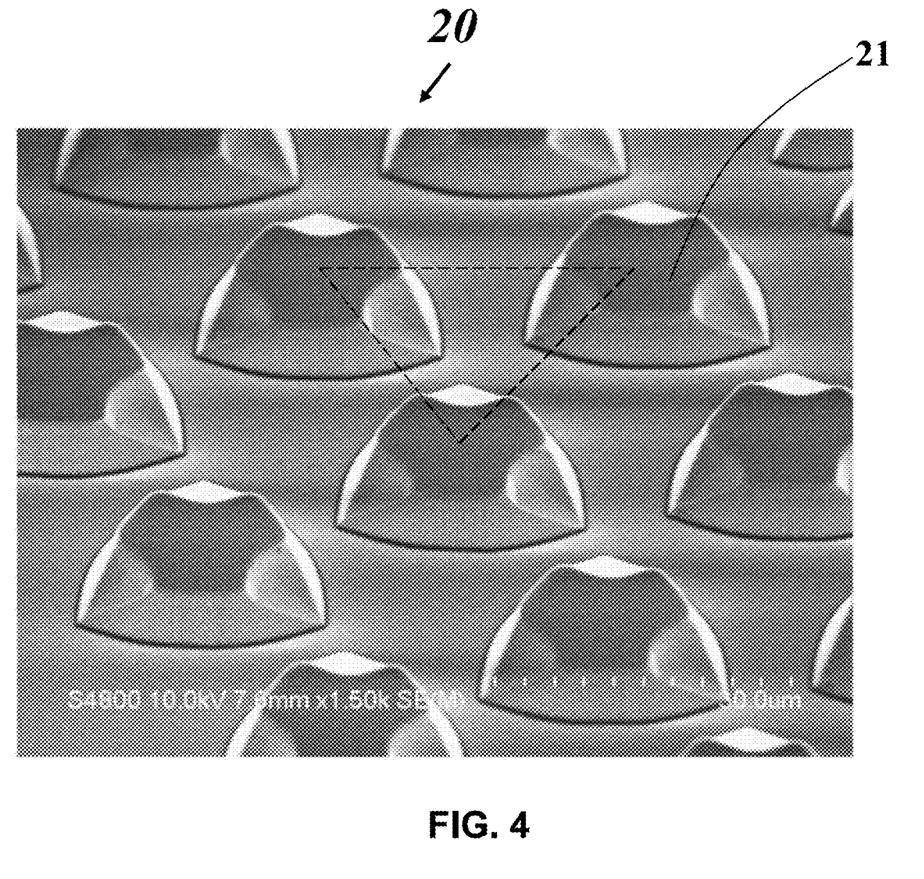
FIG. 4 illustrates an overall perspective view of a patterned sapphire substrate according to some embodiments.
Figure 5:
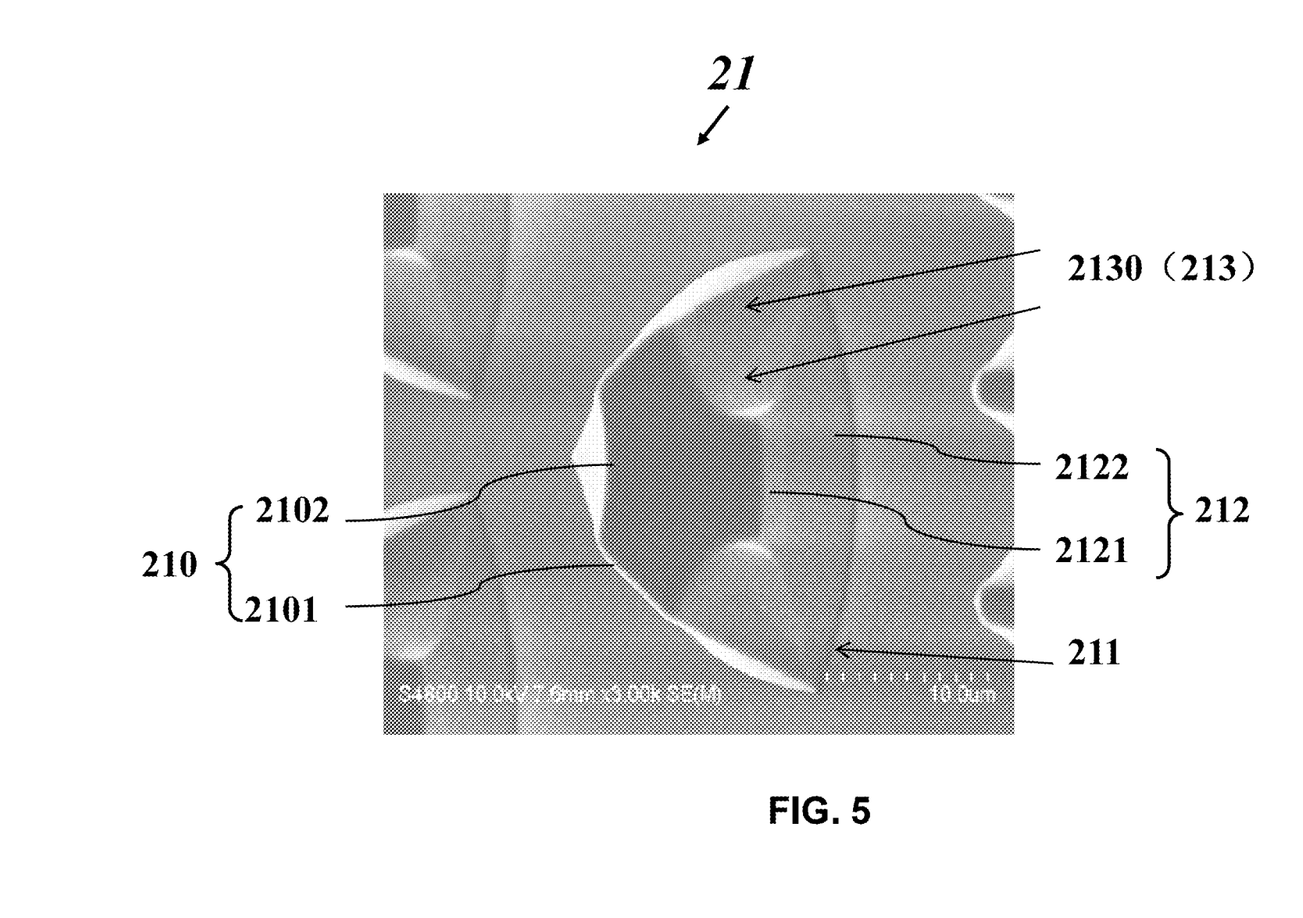
FIG. 5 illustrates a schematic side view of a single pattern of a patterned sapphire substrate according to some embodiments.
Figure 6:
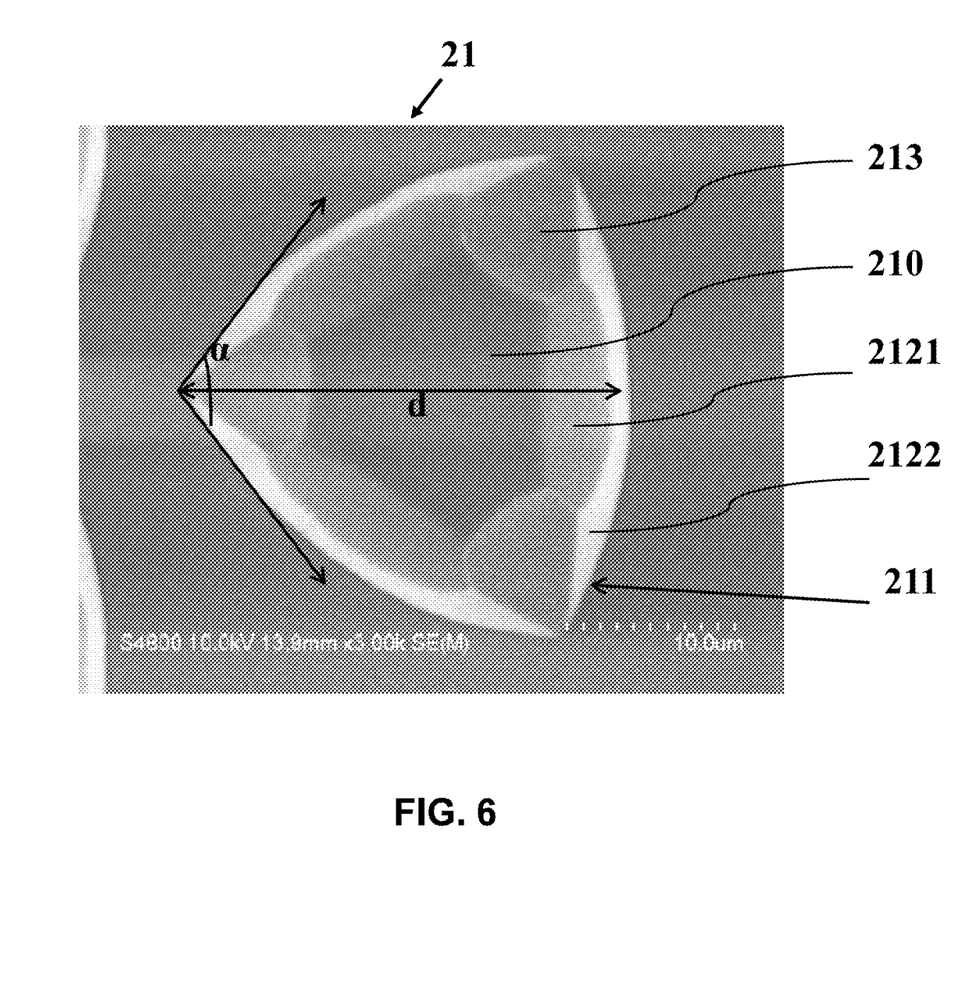
FIG. 6 illustrates a schematic top view of a single pattern of a patterned sapphire substrate according to some embodiments.

With references to FIGS. 4 to 6, a patterned sapphire substrate 20 has a first surface and a second surface opposite to each other, wherein, the first surface is formed by arranging a plurality of interspaced patterns 21. The pattern 21 is 0.8-3 μm high with periodically-arranged space of 0.1-10 μm, and adjacent 3 patterns 21 are arranged in a triangle. The pattern 21 has a top surface 210, a bottom surface 211, a plurality of side faces 212, and a concave region 213 sandwiched between two adjacent side surfaces 212, where, depth and width of the concave region 213 gradually decrease from the top to the bottom of the pattern 21.

In some embodiment, the pattern top surface 210 is a polygonal plane having three convex structures 2101 that are parallel with the first surface of the substrate 20, and all are the C surfaces of the substrate; In some embodiments, form a convex structure 2101 corresponding to the side surface 212, and form a concave structure 2102 between the adjacent convexes corresponding to the concave region 213. The side surface 212 includes a first side surface 2121 and second side surface 2122 with different inclinations arranged on the upper and lower parts of the pattern 21, in which, inclination of the first side surface 2121 is less than that of the second side surface 2122, i.e., inclined angle between the first side surface 2121 and the top surface 210 is less than that between the second side surface 2122 and top surface 210, and the second side surface 2122 appears as an arcuation. The bottom surface 211 of the pattern 21 has three corners and the connection line of the corners appears an arcuation, so that the three second side surfaces 2122 appear as an arcuation, where, inclined angle α' between connection lines of two corners is 105°-115°, and the bottom width d' is 4-20 μm. The pattern 21 is 0.8-3 μm high with periodically-arranged space of 0.1-10 μm, and adjacent 3 patterns 21 are arranged in a triangle. The concave region 213 is connected by two inclined surfaces 2130; In some embodiments, the projection on the pattern bottom surface 211 is a triangle, and two inclined surfaces 2130 appear in axial symmetry with inclined angle of 90-150°. In some other embodiments, sizes of the two inclined surfaces 2130 can be set as required. Number of the concave regions 213 can be designed to be 1-3 based on design requirements. In some embodiments in the present disclosure, the design of the concave region 213 is to enlarge the light reflection area on the surface of the pattern 21. Therefore, 3 concave regions 213 are set in this embodiment.

As compared with the pattern 11 of the conventional patterned sapphire substrate 10 shown in FIG. 3, in various embodiments of the present disclosure, the surface of the pattern 21 of the substrate 20 includes 3 concave regions 213 that are set to enlarge the light reflection area. In addition, inclined angle α' between connection lines of two corners at the pattern bottom surface 211 is about 10° larger than the corresponding inclined angle α in the substrate pattern 11 of the prior art, and the bottom width d' of the pattern 21 increases accordingly to enlarge light reflection area on the surface of the pattern 21, thus improving light extraction efficiency of the patterned sapphire substrate.

Figure 8:
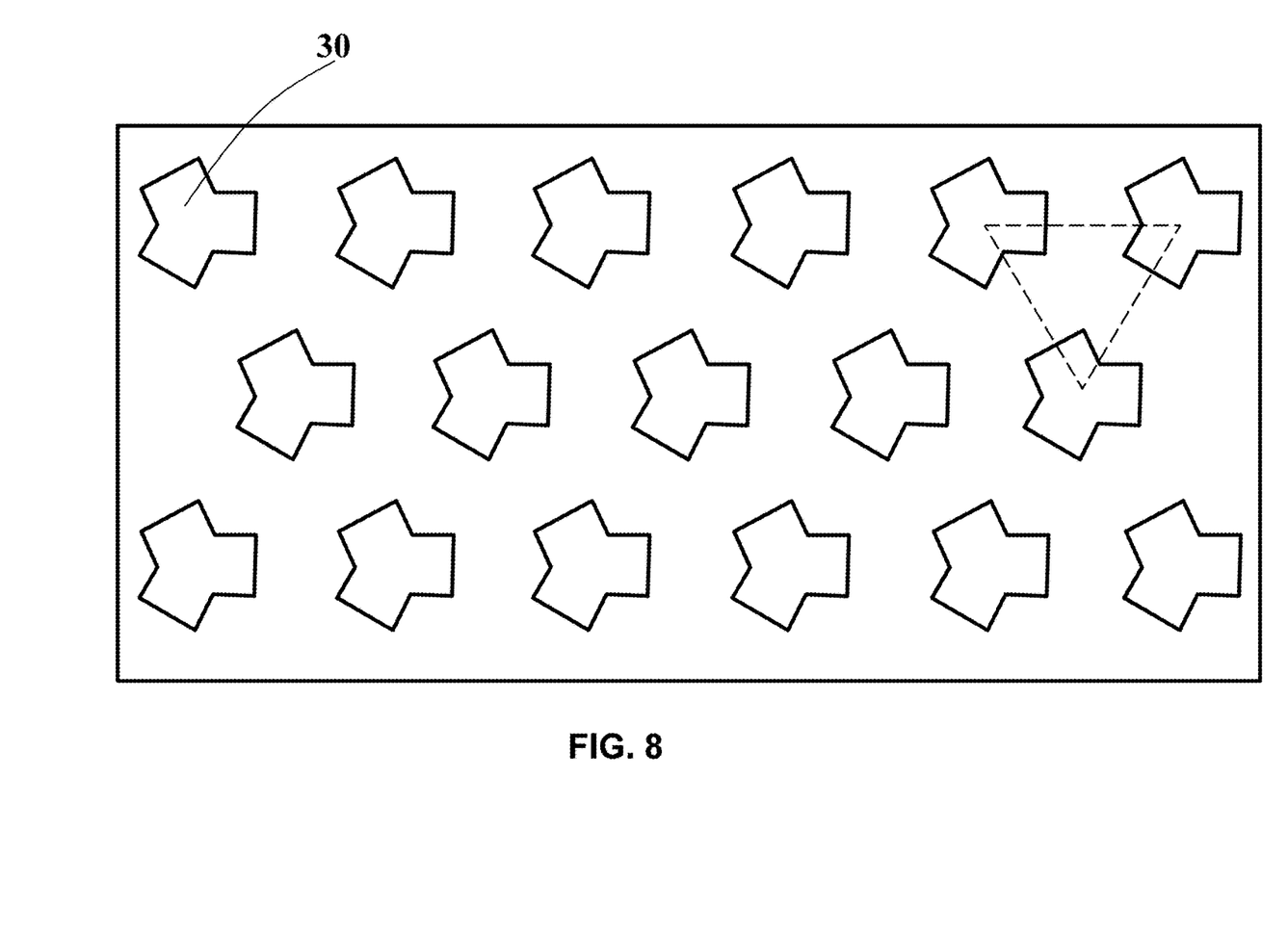
FIG. 8 shows a mask layer pattern for making a patterned sapphire substrate according to some embodiments.
Figure 9:
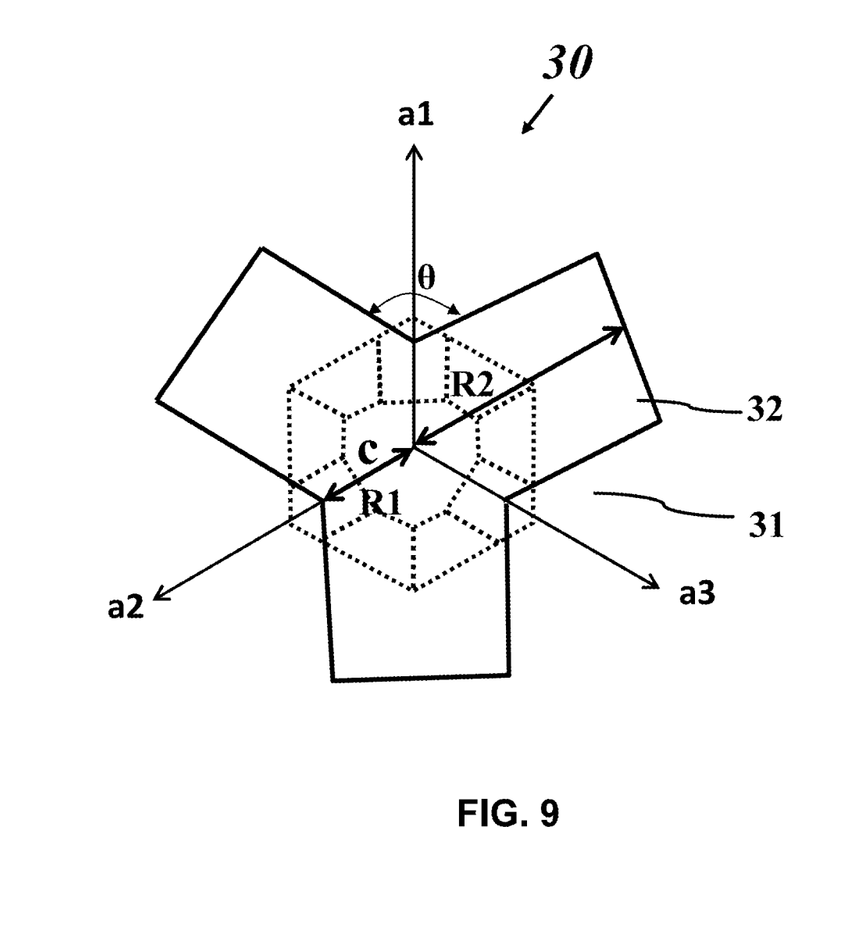
FIG. 9 illustrates an enlarged view of the mask pattern shown in FIG. 8.

A method for fabricating the abovementioned patterned sapphire substrate according to some embodiments is described with reference to FIGS. 7-9.

Figure 7:
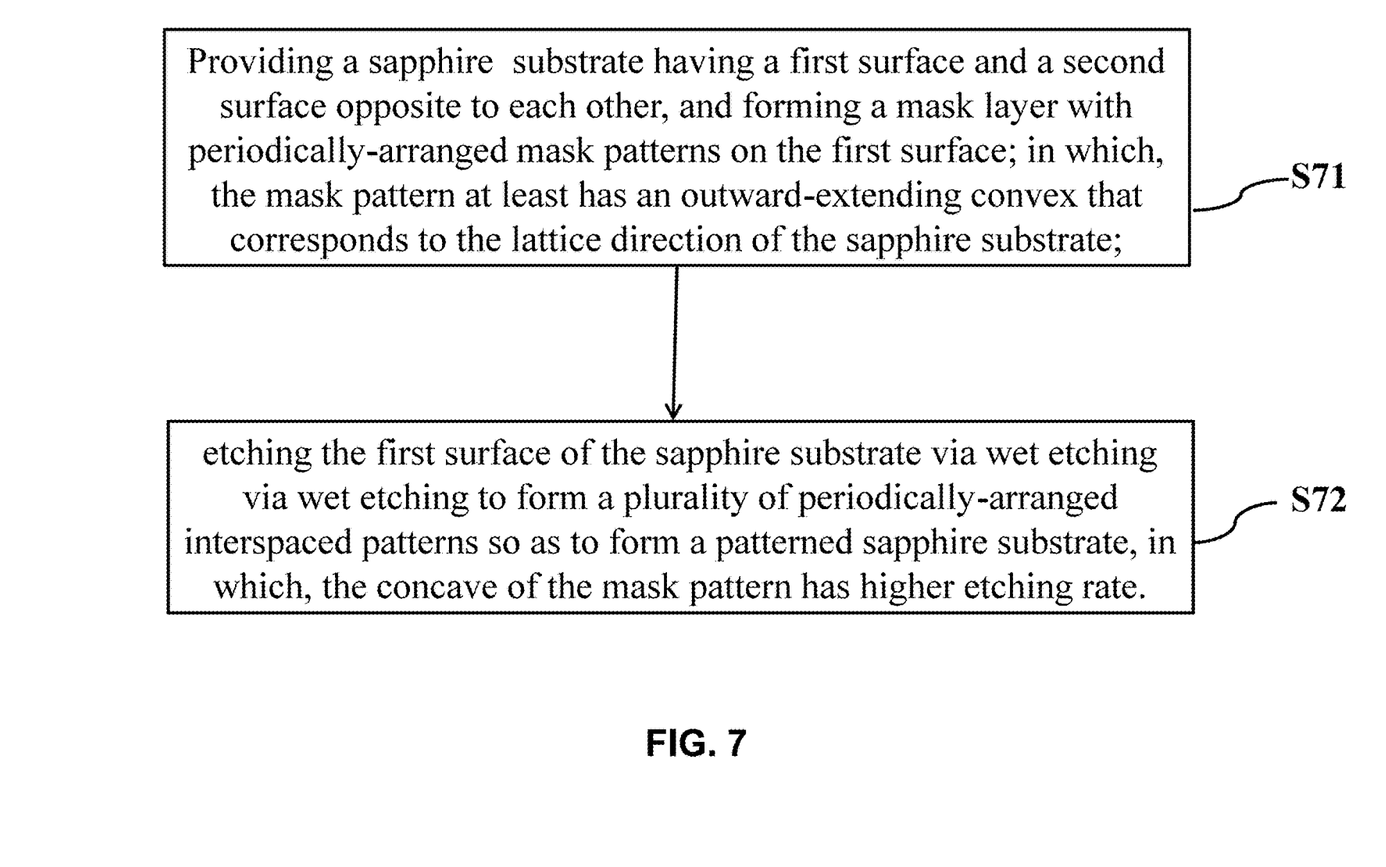
FIG. 7 shows a flow diagram of a fabrication method for the patterned sapphire substrate according to some embodiments.

With reference to FIG. 7, a fabrication method for the patterned sapphire substrate is provided, including the following steps:

S71: providing a sapphire plain substrate having a first surface and a second surface opposite to each other, and forming periodically-arranged patterned mask layers on the first surface; in which, the first surface is the C surface of the sapphire substrate, and the patterned mask layers are arranged on the C surface of the sapphire substrate;

S72: forming a plurality of periodically-arranged inter-spaced patterns 21 on the first surface via wet etching, as shown in FIG. 4, the structure thereof is described in detail with reference to the aforementioned. Form a patterned sapphire substrate 20 by wet etching of the first surface of the sapphire substrate with mixture of concentrated sulfuric acid and phosphate, in which, volume ratio of concentrated sulfuric acid and phosphoric acid is 1:1-10:1; etching time is 500-3,500 s, and etching temperature is 150° C.-300° C.

In the aforementioned method, the mask pattern formed in step S71 is the key for forming the pattern shown in FIG. 4. With reference to FIGS. 8 and 9, the mask pattern 30 has at least one outward extending recess 31 corresponding to lattice directions (a1, a2, a3) of the sapphire substrate. In some embodiments, the mask pattern 30 also has a plurality of outward extending projections 32 corresponding between the lattice direction of the sapphire substrate. In some embodiments, the concave 31 and the convex 32 are alternately arranged with consistent number of the sapphire lattice direction, and the number of the concave 31 and the convex 32 is both 3. In other modified embodiments, the number of the concave 31 and the convex 32 can be 1 or 2.

In the surface pattern 21 of the sapphire substrate shown in FIG. 4, number of the concave regions 213 corresponds to that of the concaves 31; and inclined angle between two inclined surfaces 2130 in the concave region 213 corresponds to the inclined angle θ between two adjacent convexes 32 in the pattern 30. The inclined angle θ between the adjacent convexes 32 can be same or different, with range of 90°-150°. The distance between the edge and center of the pattern 30 is 0.25-10 μm. In some embodiments, the distance R1 between the edge and center of the concave 31 is 0.25-2.5 μm, and the distance R2 between the edge and center of convex 32 is 0.75-10 μm; the pattern 30 is 1-10 μm high, and the space between patterns of the patterned mask layer 30 is 0.5-10 μm; and material of the patterned mask layer is photo-resistor, oxide or metal.

In some embodiments, pattern of patterned mask layer 30 roughly appears in a "windmill" shape, which has at least one concave 31 extending outwardly and corresponding to the lattice direction of the sapphire substrate, and a plurality of convex 32 extending outwardly and corresponding between the lattice directions of the sapphire substrate. Therefore, during wet etching in S72, the etching chemical corrosion solution has higher etching rate along the concave 31, and lower rate along the convex 32, making the formed pattern 21 of the patterned sapphire substrate 20 after etching have three concave regions 213 for light reflection. Moreover, bottom width d' of the pattern 21 is increased to enlarge light reflection area of the pattern 21, thus improving light extraction efficiency of the patterned sapphire substrate 20.

Figure 10:
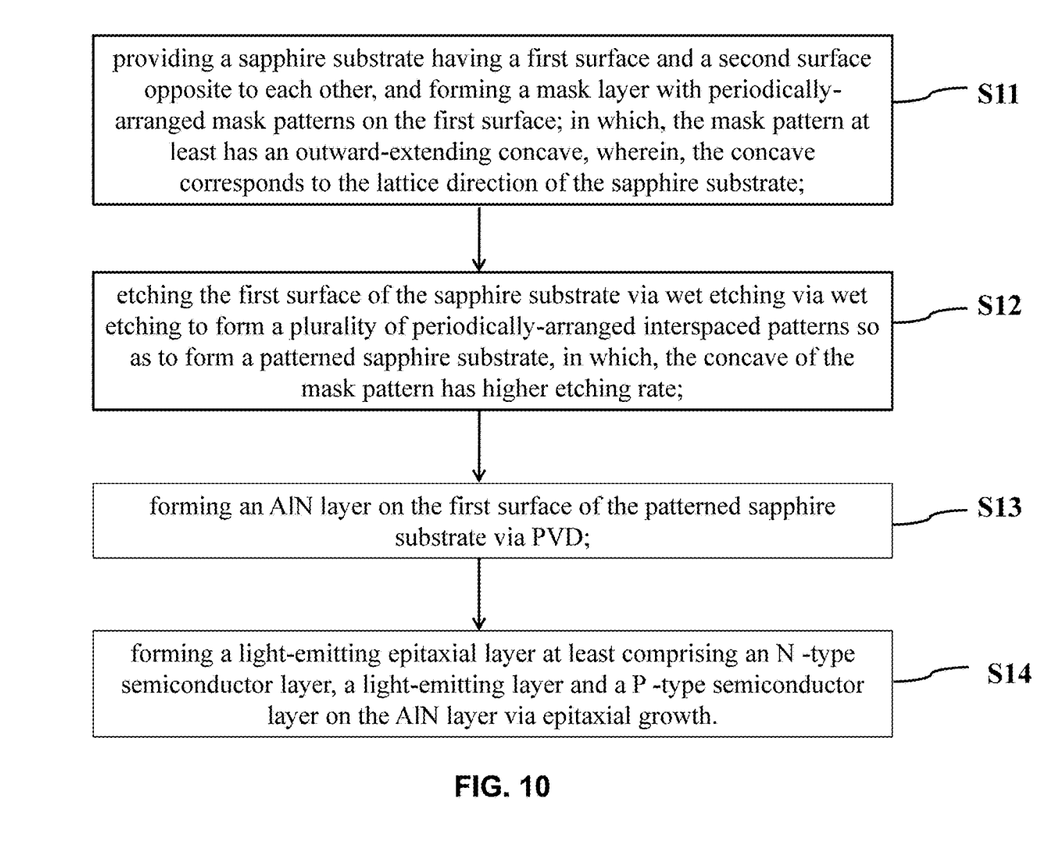
FIG. 10 shows a flow diagram of a fabrication method for the light-emitting diode according to some embodiments.

FIG. 10 shows the flow diagram for fabricating a light-emitting diode according to the present disclosure, which includes the steps of S11-S14, wherein, in steps S11-S12, a patterned sapphire substrate is formed; in S13, an AlN layer is formed on the patterned sapphire substrate 20 via PVD; and in S14, a light-emitting epitaxial layer is formed via epitaxial growth on the AlN layer. Steps are described briefly below, in which, steps S11-S12 can be referred to the aforesaid descriptions.

S13: Form an AlN layer on the surface of the patterned sapphire substrate 20 formed in steps S11-S12 via PVD; In some embodiments, this layer is 10-200 Å thick.

S14: Grow a buffer layer, an N-type semiconductor layer, a light-emitting layer and a P-type semiconductor layer in sequence through epitaxial growth, wherein, the buffer layer is III Group based nitride material, preferably GaN, AlN or AlGaN; the N-type semiconductor layer is preferably GaN or AlGaN with preferable Si doping concentration of $1 \times 10^{19}$ cm$^{-3}$; the light-emitting layer preferably includes at least a quantum well structure, which is preferred to be composed of 5-50 pairs of quantum wells; and the P-type semiconductor layer is preferably GaN and Mg-doped with doping concentration of $1\times10^{19}\sim5\times10^{21}$ cm$^{-3}$, and preferably, the P-type semiconductor layer is a multi-layer structure including a P-type electron blocking layer, a P-type conductive layer and a P-type contact layer, wherein, the P-type electron blocking layer is closely adjacent to the light-emitting layer for preventing electrons from entering the P-type layer to recombine with hole. In some embodiments, the material is AlGaN and thickness is 50-200 nm.

Figure 11:
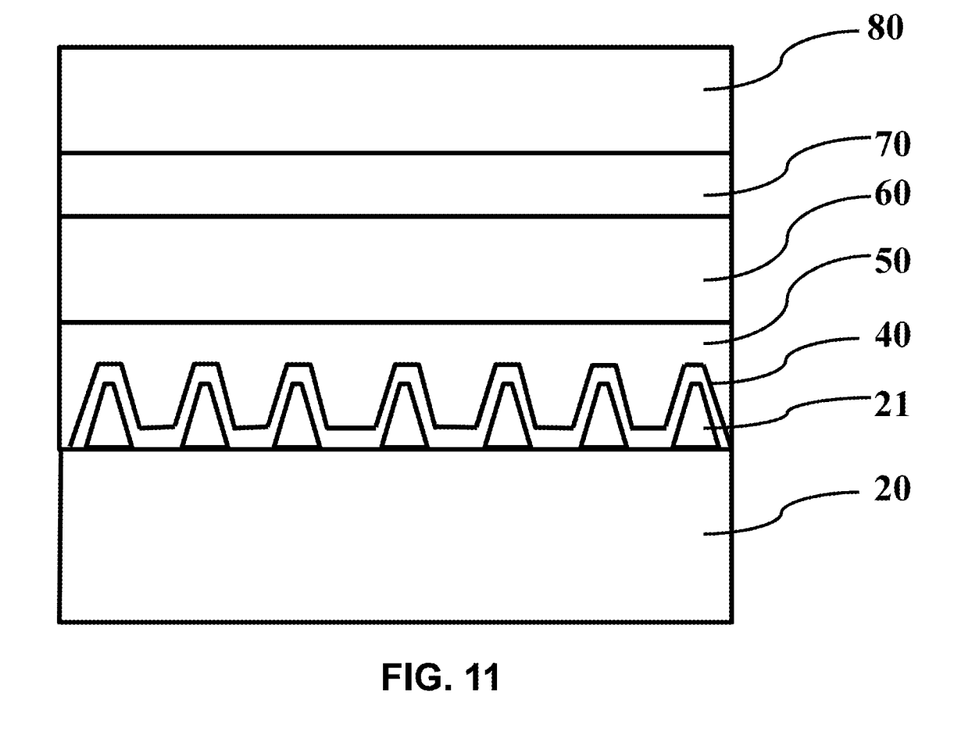
FIG. 11 shows a structural diagram of the light-emitting diode according to some embodiments.

FIG. 11 shows a structure diagram of a light-emitting diode formed according to the method in FIG. 10, including: a patterned sapphire substrate 20, an AlN layer 40, a buffer layer 50, an N-type semiconductor layer 60, a light-emitting layer 70 and a P-type semiconductor layer 80. In some embodiments of the light-emitting diode, 3 concave regions 213 are added on the surface of the patterned sapphire substrate 20, and the bottom width of the pattern 21 increases accordingly to enlarge light reflection area on the surface of the pattern 21, thus improving light extraction efficiency of the patterned sapphire substrate 20.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A patterned sapphire substrate having a first surface and a second surface opposite to each other, wherein:
   the first surface of the substrate is formed by arranging a plurality of interspaced patterns;
   the patterns have a plurality of side surfaces and at least one concave region sandwiched between adjacent side surfaces;
   a width of the concave region gradually decreases, and the concave region gradually becomes shallower, from a top to a bottom of the patterns;
   wherein:
   the patterns further comprise a top surface and a bottom surface, and the concave region is sandwiched between the adjacent side surfaces and the top surface of the patterns;
   the concave region is connected by two inclined surfaces; and
   a projection of the concave region on the bottom surface of the patterns appears as a triangle.

2. The patterned sapphire substrate of claim 1, wherein: the two inclined surfaces appear in axial symmetry.

3. The patterned sapphire substrate of claim 1, wherein: an inclined angle between the two inclined surfaces is 90°-150°.

4. The patterned sapphire substrate of claim 1, wherein: the side surfaces comprise a first side surface and a second side surface with different inclinations that are arranged on upper and lower portions of the patterns respectively.

5. The patterned sapphire substrate of claim 4, wherein: the second side surface appears as an arcuation.

6. The patterned sapphire substrate of claim 1, wherein: the substrate pattern bottom is 4-20 μm wide.

7. A patterned sapphire substrate having a first surface and a second surface opposite to each other, wherein:
   the first surface of the substrate is formed by arranging a plurality of interspaced patterns;
   the patterns have a plurality of side surfaces and at least one concave region sandwiched between adjacent side surfaces;
   a width of the concave region gradually decreases, and the concave region gradually becomes shallower, from a top to a bottom of the patterns;
   wherein:
   the side surfaces comprise a first side surface and a second side surface with different inclinations that are arranged on upper and lower portions of the patterns respectively; and
   inclination of the first side surface is less than that of the second side surface.

8. A fabrication method of forming the patterned sapphire substrate of claim 7, the method comprising:
   S71. providing a sapphire substrate having a first surface and a second surface opposite to each other, and forming a mask layer with periodically-arranged mask patterns on the first surface; wherein the mask patterns at least have an outward-extending concave region, and wherein the concave region corresponds to a lattice direction of the sapphire substrate;
   S72. etching the first surface of the sapphire substrate via wet etching to form a plurality of periodically-arranged interspaced patterns so as to form the patterned sapphire substrate, wherein the concave region of the mask patterns has a higher etching rate.

9. The fabrication method of claim 8, wherein: the patterns also comprise a top surface and a bottom surface, and the concave region is sandwiched between the adjacent side surfaces and the top surface of the patterns.

10. The fabrication method of claim 8, wherein: the mask patterns formed in S71 has a plurality of outward-extending convex regions, wherein, the convex regions correspond to between the lattice directions of the sapphire substrate.

11. The fabrication method of claim 10, wherein: the convex regions and the concave regions are arranged alternatively with number of 3 each.

12. The fabrication method of claim 10, wherein: the inclined angle between the adjacent convexes is 90°-150°.

13. The fabrication method of claim 10, wherein: the distance between the edge and the center of the mask pattern formed in S71 is 0.25-10 μm, the mask pattern is 1-10 μm high and the space between adjacent mask patterns is 0.5-10 μm.

14. The fabrication method of claim 8, wherein: material of the mask layer formed in S71 is a photo resistor, an oxide, or a metal.

15. A light-emitting diode comprising:
   the patterned sapphire substrate according to claim 7; and
   a light-emitting epitaxial laminated layer formed thereon.

16. The light-emitting diode of claim 15, wherein:
   an AlN layer is formed on the surface of the patterned sapphire substrate via PVD, and the light-emitting epitaxial layer is formed on the AlN layer;
   the light-emitting diode is fabricated with a fabrication method including:
   S11. providing a sapphire substrate having a first surface and a second surface opposite to each other, and forming a mask layer with periodically-arranged mask patterns on the first surface; in which, the mask pattern at least has an outward-extending concave, wherein, the concave corresponds to the lattice direction of the sapphire substrate;

S12. etching the first surface of the sapphire substrate via wet etching to form a plurality of periodically-arranged interspaced patterns so as to form a patterned sapphire substrate, in which, the concave of the mask pattern has higher etching rate;

S13. forming an AlN layer on the first surface of the patterned sapphire substrate via PVD; and S14. forming a light-emitting epitaxial layer at least comprising an N-type semiconductor layer, a light-emitting layer and a P-type semiconductor layer on the AlN layer via epitaxial growth;

the patterns formed in S12 have a plurality of side surfaces and at least one concave region sandwiched between adjacent side surfaces, where, depth and width of the concave region gradually decrease from the top to the bottom of the pattern;

the pattern also comprises a top surface and a bottom surface, and the concave region is sandwiched between the adjacent side surface and the top surface;

the mask pattern formed in S11 also has a plurality of outward-extending convexes corresponding between the lattice directions of the sapphire substrate;

the convexes and the concaves are arranged alternatively with number of 3each; and the AlN layer in step S3' is 10-200 Å thick.

\* \* \* \* \*